(12) United States Patent
Teppan et al.

(10) Patent No.: US 8,797,020 B2
(45) Date of Patent: Aug. 5, 2014

(54) CLOSED-LOOP FLUXGATE CURRENT SENSOR

(75) Inventors: Wolfram Teppan, Collonges-Sous-Salève (FR); Davide Azzoni, Meyrin (CH)

(73) Assignee: LEM Intellectual Property SA, Fribourg (CH)

( * ) Notice: Subject to any disclaimer, the term of this patent is extended or adjusted under 35 U.S.C. 154(b) by 330 days.

(21) Appl. No.: 13/319,916

(22) PCT Filed: May 10, 2010

(86) PCT No.: PCT/IB2010/052059
§ 371 (c)(1),
(2), (4) Date: Nov. 10, 2011

(87) PCT Pub. No.: WO2010/131187
PCT Pub. Date: Nov. 18, 2010

(65) Prior Publication Data
US 2012/0062209 A1    Mar. 15, 2012

(30) Foreign Application Priority Data

May 11, 2009   (EP) ..................................... 09159946

(51) Int. Cl.
*G01R 15/20* (2006.01)
(52) U.S. Cl.
USPC ................... 324/117 R; 324/117 H; 324/126; 324/128
(58) Field of Classification Search
USPC ...................................... 324/117 R, 126–128
See application file for complete search history.

(56) References Cited

U.S. PATENT DOCUMENTS

| 3,626,280 | A |   | 12/1971 | Van Englehoven et al. |
| 5,008,612 | A | * | 4/1991 | Otto .......................... 324/117 R |

(Continued)

OTHER PUBLICATIONS

International Search Report and the Written Opinion of the International Searching Authority issued by the European Patent Office, Rijswijk, Netherlands, dated Aug. 10, 2010, for International Application No. PCT/IB2010/052059; 15 pages.

(Continued)

*Primary Examiner* — Huy Q Phan
*Assistant Examiner* — Dustin Dickinson
(74) *Attorney, Agent, or Firm* — Faegre Baker Daniels LLP

(57) ABSTRACT

Electrical current sensor comprising a measuring circuit (6) and an inductor (4) for measuring a primary current $I_P$ flowing in a primary conductor (2), the inductor comprising a saturable magnetic core (10) made of a highly permeable magnetic material and a secondary coil (12) for carrying an alternating excitation i configured to alternatingly saturate the magnetic core, the coil being connected to the measuring circuit. The measuring circuit is configured to supply a positive or negative voltage to the inductor, to switch off the voltage when a condition signalling saturation is reached, to measure the time to saturation $t_1$ in one direction and the time to saturation $t_2$ in the other direction of the magnetic core and determine therefrom a value of the primary current for small current amplitudes, the measuring circuit being further configured for evaluating the average value of the excitation current i and determining therefrom the value of the primary current for large currents.

14 Claims, 3 Drawing Sheets

(56) References Cited

U.S. PATENT DOCUMENTS

| | | | | |
|---|---|---|---|---|
| 5,229,725 | A * | 7/1993 | Spaeder et al. | 324/522 |
| 6,160,697 | A * | 12/2000 | Edel | 361/143 |
| 6,166,539 | A | 12/2000 | Dahlberg et al. | |
| 6,522,517 | B1 * | 2/2003 | Edel | 361/143 |
| 7,358,716 | B2 * | 4/2008 | Preusse et al. | 324/117 R |
| 2006/0158176 | A1 * | 7/2006 | Preusse et al. | 324/117 R |
| 2012/0139527 | A1 * | 6/2012 | Teppan et al. | 324/127 |

OTHER PUBLICATIONS

Primdahl F.; Ripka P.; Petersen J R; Danish Space Research Institute, Lyngby, Denmark: "The sensitivity parameters of the short-circuited fluxgate"; *Measurement Science and Technology*, IOP, Bristol, GB, vol. 2, No. 11, Nov. 1, 1991, pp. 1039-1045, XP020065124; ISN: 0957-0233; Section 1-Section 3.

\* cited by examiner

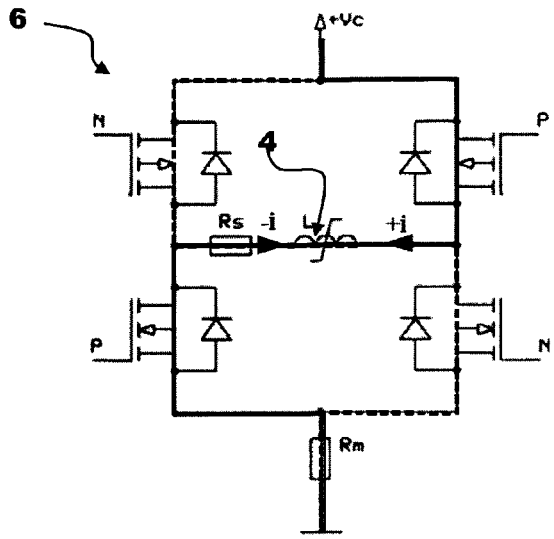
Fig 7
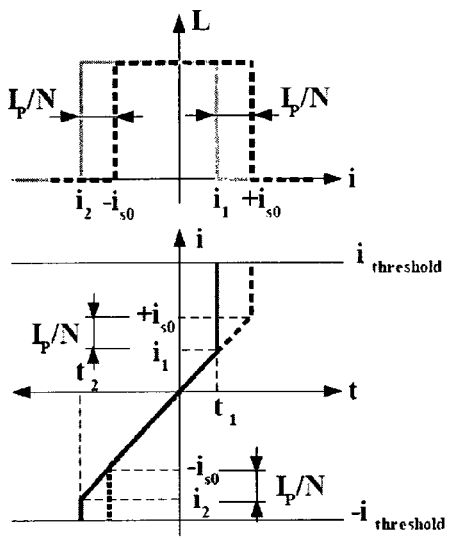
Fig 8a
Fig 8b
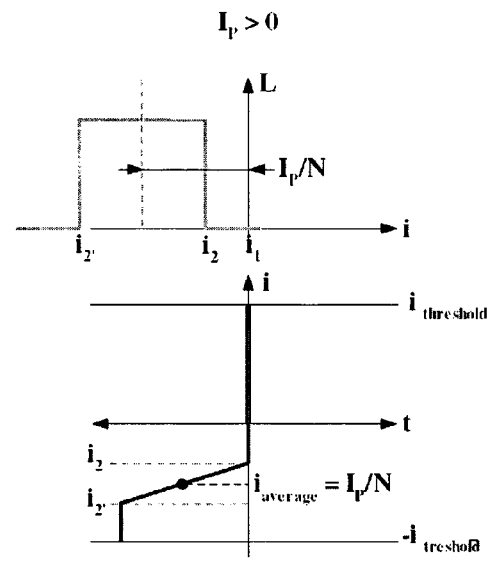
Fig 9a
Fig 9b
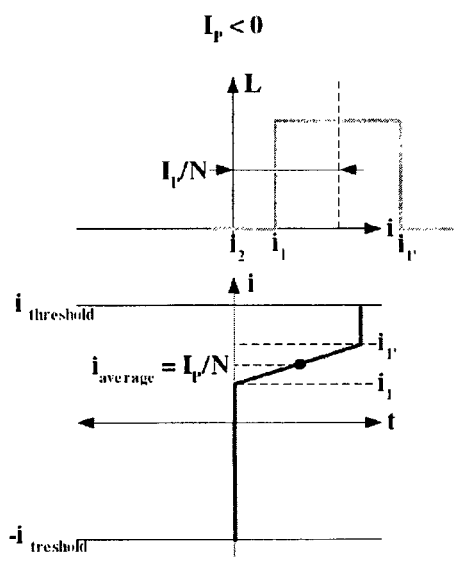
Fig 10a
Fig 10b

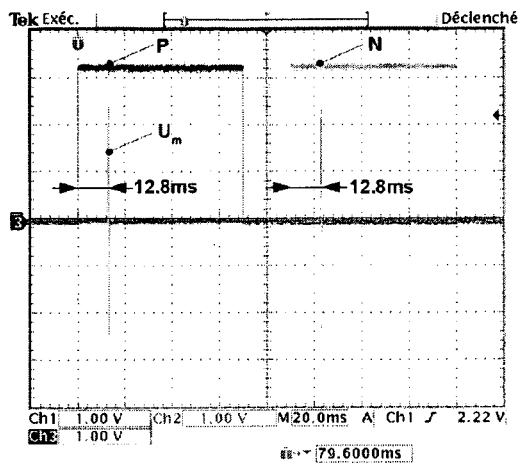
Fig 11
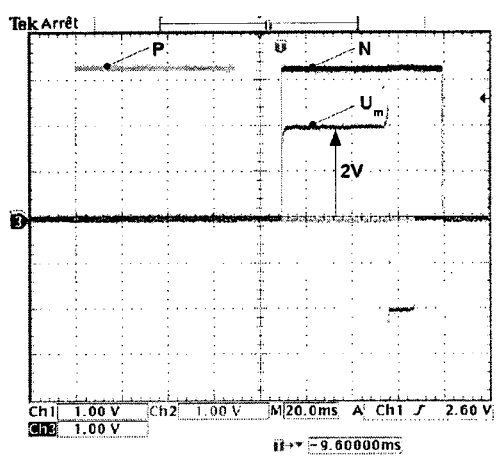
Fig 12
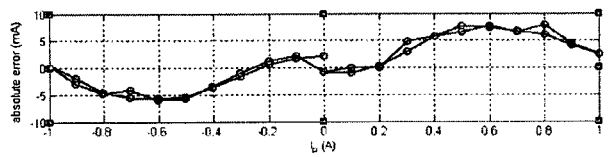
Fig 13 Sensor current error (mA) for $-1\,A \leq I_P \leq 1\,A$.
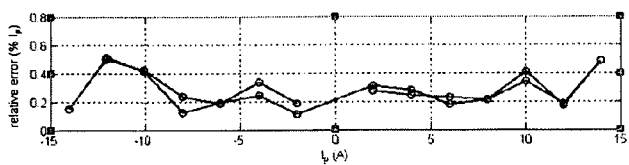
Fig 14 Transducer current error (%) for $-15\,A \leq I_P \leq 15\,A$.
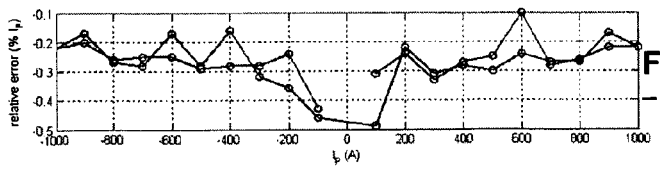
Fig 15 Transducer current error (%) for $-1000\,A \leq I_P \leq 1000\,A$

CLOSED-LOOP FLUXGATE CURRENT SENSOR

The present invention relates to a closed-loop current sensor, in particular of the fluxgate type.

A conventional fluxgate sensor typically comprises a core in a soft magnetic material of high magnetic permeability that is subjected to an alternating magnetic field by an excitation coil of the fluxgate. The magnetic field of the excitation coil saturates the core in an alternating manner. In the presence of a magnetic field, for example an external magnetic field generated by a current flowing in a primary conductor, the saturation characteristic of the soft magnetic core becomes (apparently, as seen from the secondary side) asymmetric and generates a corresponding signal in the circuit driving the fluxgate coil. The resulting signal is correlated to the amplitude of the external magnetic field. In a closed-loop sensor, this signal is used in a feedback loop to drive a secondary coil on a magnetic circuit configured to cancel the effect of the external magnetic field. The main advantage of closed-loop fluxgate sensors is their measurement sensitivity and ability to accurately measure currents of small amplitude. On the other hand, such sensors are generally not best suited for the measurement of currents of large amplitude, and like other sensors, have a limited measurement range.

Certain applications require however the measurement of a large range of currents. An example of an application requiring the accurate measurement of small amplitude currents and a large measurement range, is monitoring of batteries. Battery monitoring may include measuring different parameters of a battery system, temperature, voltage, impedance and current, in order to evaluate the status (charge, health) of the battery [2]. Often it is necessary to monitor complex systems made of several hundreds of blocks, e.g. at industrial UPS, telecommunications systems, or battery storage systems. One of the difficulties concerning battery monitoring applications is the current measurement, where the measurement range (DC) may typically vary from 10 mA up to 1000 A. Today's available low cost current transducers are not well adapted to work with sufficient accuracy for the small amplitude currents while supporting the very large measurement range, which may vary from a few milliamperes of trickle charging (float) currents to several hundreds of amperes of battery discharge and recharge currents.

Certain electrical motors, generators and other electrical drives may also require the measurement of currents over a very large range for accurate and reliable control of the drive or generator.

An object of the invention is to provide a current sensor that accurately measures small currents, yet has a large measurement range.

It is advantageous to provide a current sensor that is economical to produce.

It is advantageous to provide a current sensor for battery monitoring that is accurate and economical to produce.

It is advantageous to provide a current sensor that is easy to implement.

It is advantageous to provide a current sensor that is compact and reliable.

Objects of the invention have been achieved by providing the closed-loop fluxgate sensor according to claim 6 and a current measuring method according to claim 1.

Disclosed herein is a fluxgate electrical current sensor comprising a measuring circuit and an inductor for measuring a primary current $I_P$, flowing in a primary conductor over a current range from a minimum measurable or specified current amplitude ($I_{min}$) to a maximum measurable or specified current amplitude ($I_{max}$), the inductor comprising a saturable magnetic core made of a highly permeable magnetic material and a secondary coil for applying an alternating excitation current i configured to alternatingly saturate the magnetic core, the coil being connected to the measuring circuit. The measuring circuit is configured to measure the saturation times $t_1$ and $t_2$ of the magnetic core in opposing magnetic field directions and determine therefrom a value of the primary current for small current amplitudes, the measuring circuit being further configured for evaluating the average value of the excitation current i and determining therefrom the value of the primary current for large currents.

A method of measuring an electrical current flowing in a primary conductor over a current range from a minimum specified current amplitude to a maximum specified current amplitude according to this invention includes:
- providing a current sensor including a measuring circuit and an inductor, the inductor comprising a secondary coil wound around a saturable magnetic core,
- applying an excitation voltage to the secondary coil configured to alternatingly saturate the magnetic core,
- evaluating the average value of the excitation current flowing through the inductor during the phases when the voltage source is turned on for measurement of large primary currents, and
- measuring the times to saturation $t_1$, $t_2$ of the magnetic core of the negative respectively positive signal of the alternating excitation current and for small currents determining the primary current based on the relationship of alternating saturation times $t_1$, $t_2$.

Small primary currents have amplitude in a first portion of the current range from the minimum specified current $I_{min}$ to a transition or intermediate amplitude, and large primary currents have an amplitude in a second portion of the current range from the transition amplitude to the maximum specified current amplitude $I_{max}$. The value of the intermediate amplitude, where the transition from the first measurement method to the second measurement method, may vary as a function of the values of $I_{min}$ and $I_{max}$.

The current sensor according to this invention, which is based on a technology of type "fluxgate", is economical to produce and implement yet has a wide measurement range while providing excellent accuracy. The sensor uses the magnetic field created by a primary current acting on a saturable inductor. By measuring the intervals to reach saturation and the inductor load current and making use of a suitable microcontroller it is possible to accurately evaluate the value of the primary current for both high and low current levels.

For primary currents $I_P$ that are small, the primary current value may be determined based on a value of the saturation time in one direction divided by the sum of the saturation times in both directions ($I_P$ is proportional to $t_1/(t_1+t_2)$).

The measuring method for small currents is preferably employed for primary currents respecting the following condition:

$$\left|\frac{I_P}{N}\right| < i_{s0}$$

where $I_P$ is primary current, N the number of turns of the secondary coil, and $i_{s0}$ the value of the saturation excitation current for a primary current that is 0.

For large primary currents the measurement of the primary current may be based on an evaluation of the average value of the excitation current.

Further objects and advantageous features of the invention will be apparent from the claims and the following detailed description of embodiments of the invention and the annexed drawings in which:

FIG. 7 illustrates a circuit diagram of an embodiment of a measuring circuit of a current sensor according to this invention;

FIGS. 8a and 8b are simplified graphs illustrating the shifting of the inductance value, respectively the saturation times $t_1$, and $t_2$ for a positive primary current ($I_P>0$);

FIGS. 9a and 9b are graphical illustrations of the inductance as a function of current respectively the current as a function of time for a positive primary current to depict the relationship between the primary current and the excitation current;

FIGS. 10a and 10b are similar to FIGS. 9a, 9b but for a negative primary current;

FIG. 11 is a screen-shot of an oscilloscope illustrating saturation times for a positive excitation current signal P and a negative excitation current signal N for a primary current that is 0;

FIG. 12 is a screen-shot of an oscilloscope for a voltage $U_m$ at a primary current of 1000 Ampere;

FIGS. 13 to 15 illustrate test results of a prototype current sensor made according to the invention where FIG. 13 illustrates measured current error in milliamperes for a primary current in the range of −1 to +1 amperes, FIG. 14 illustrates the sensor error in percentage for a primary current ranging from −15 to +15 amperes, and FIG. 15 illustrates the sensor error in percentage for a primary current in the range of −1000 to +1000 amperes.

Figure 1:
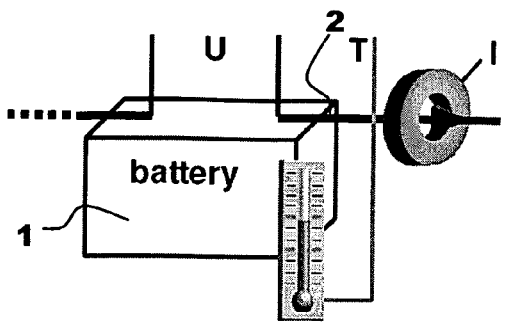
FIG. 1 is a simplified illustration of a battery monitoring system indicating the measured parameters.
Figure 2:
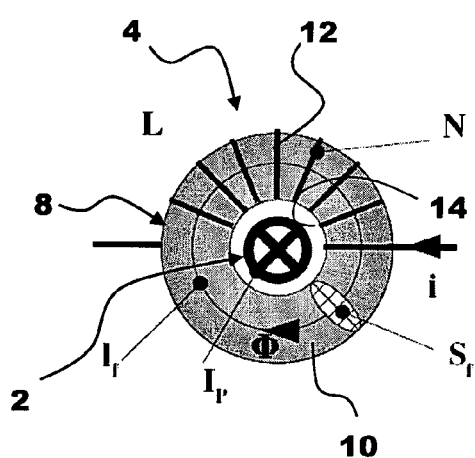
FIG. 2 illustrates a saturable inductor of a current sensor according to an embodiment of this invention and its main parameters.

Referring to FIGS. 1, 2 and 7, an embodiment of a current sensor according to this invention, for measuring a primary current $I_P$ flowing in a primary conductor 2, for example connected to a battery 1 or other electrical device or motor, the primary current corresponding to the charge or discharge current of the battery, or a drive current of an electrical motor. The sensor comprises an inductor 4 (representing an inductance L) connected to a measuring circuit 6. The inductor comprises a magnetic circuit 8 comprising a magnetic core 10 made of a high magnetic permeability material (soft magnetic material), and a secondary coil (also called herein excitation coil) 12 wound around at least a portion of the saturable magnetic core 10. The secondary coil 12 is connected to the measuring circuit 6 which feeds an excitation current +i, −i through the secondary coil, the excitation current being configured to alternatingly saturate the magnetic core in one direction and then in the opposed direction. In the embodiment shown, the magnetic core is in the form of an annular closed ring having a central passage 14 through which the primary conductor extends.

The primary conductor is shown as a single conductor passing straight through the central passage of the magnetic core, however it is also possible to have a primary conductor with one or more turns (windings) around a portion of the saturable core. The portion of primary conductor may be integrated to the current sensor and comprises connection terminals for connection to an external primary conductor of the system to be measured. The primary conductor may also be separate from the sensor and inserted through the sensor. The magnetic core may have other shapes than circular, for example rectangular, square, polygonal or other shapes. Moreover, the magnetic core of the inductor may also form a non-closed circuit, for example in the form of a bar or an almost closed magnetic core with an air gap. The magnetic core may also be formed of more than one part, for example of two halves or two parts that are assembled together around the primary conductor. Also, the current sensor may comprise a magnetic core that does not have a central passage through which the primary conductor extends whereby the primary conductor can be positioned in proximity of the magnetic core or wound around in one or more turns around a portion of the magnetic core. In these various configurations, the functioning principle remains essentially the same whereby the excitation in the secondary coil is an alternating current that saturates the magnetic core in alternating directions, and where the primary current generates a magnetic field that affects the saturation characteristic of the magnetic core.

In the present invention, for small currents the measuring circuit measures the shift of the inductance characteristic as a function of the excitation current, this shift being essentially proportional to the amplitude of the primary current. For large primary currents however, this measuring principle is no longer employed because the core is already completely saturated without any secondary (excitation) current and the result of the relationship $t_1/(t_1+t_2)$ does not change any more. For high currents the measuring circuit thus employs another measurement method, this method comprising evaluating the average value of the secondary coil excitation current during the time the excitation voltage is supplied, i.e. $t_1$ or $t_2$ which corresponds to the amplitude of the primary current as described in more detail hereafter.

Advantageously, a single, simple and low cost sensor can thus be used for measuring a very large current range.

FIGS. 1 and 2 illustrate parameters of a battery monitoring system with a closed-loop current sensor, where:
N is the number of secondary turns
$I_{Fe}$ is the average magnetic circuit length
$S_{Fe}$ is the magnetic circuit cross section
i is the excitation current
$I_P$ is the primary current (to be measured), and
φ is the magnetic flux.

The main difficulty in this type of application is the measurement of the current, because it can vary in a very large range, from the few milliamperes of the trickle charging (float) currents to the several hundreds of ampere of the battery discharge and recharge currents.

The main parameters of the saturable inductor are defined in FIG. 2. While knowing the characteristics B(H) of the core, as well as the geometric parameters of the magnetic circuit, the inductance value can be defined as a function of the excitation current i.

Figure 3:
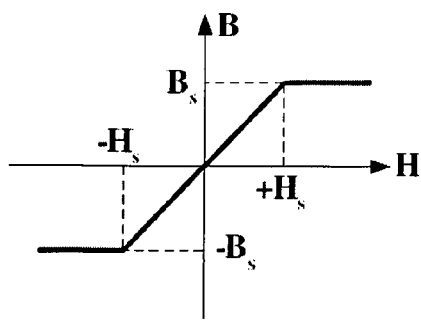
FIG. 3 is a graphical illustration of an idealized characteristic B(H) of the inductor.

The ideal characteristic B(H) (magnetic induction B as a function of the magnetic field H) of the magnetic circuit can be approximated as shown in FIG. 3. For a magnetic field value varying between $+H_s$ and $-H_s$ the core is not saturated, so B(H) is represented by the well known equation (1):

$$B(H)=\mu_0 \cdot \mu_r \cdot H \text{ if } -H_s<H<+H_s \quad (1)$$

where $\mu_0$ is the permeability coefficient of air, and $\mu_r$ is the relative permeability coefficient of the magnetic material of the circuit.

Figure 4:
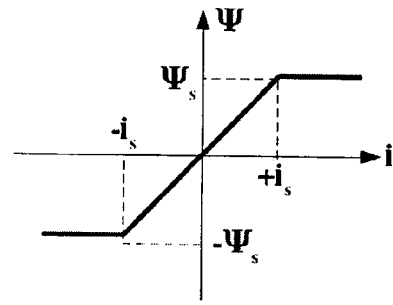
FIG. 4 is a graphical illustration of an idealized characteristic of flux linkage ψ(i) as a function of current/flowing in a secondary coil of the inductor.

FIG. 4 illustrates an idealized characteristic $\psi(i)$, the flux linkage, as a function of current. The geometric parameters of the magnetic circuit as well as the number of turns N allow to determine the relationship between the flux linkage $\psi$ and the excitation current i.

$$H = \frac{N}{l_{Fe}} i \quad (2)$$

$$\Psi = \phi \cdot N = B \cdot S_f \cdot N \quad (3)$$

By replacing (2) in (1) we can obtain:

$$B = \mu_0 \cdot \mu_r \cdot \frac{N}{l_f} i \quad (4)$$

And by replacing (4) in (3) we obtain:

$$\Psi = \left( \mu_0 \cdot \mu_r \cdot \frac{N}{l_f} \cdot i \right) \cdot S_f \cdot N \quad (5)$$

and finally:

$$\boxed{\Psi(i) = \frac{\mu_0 \cdot \mu_r \cdot S_f \cdot N^2}{l_f} \cdot i} \quad (6)$$

By deriving (6) as a function of the current we obtain the inductance value as (7):

$$L_f(i) = \frac{\mu_0 \cdot \mu_r \cdot S_f \cdot N^2}{l_f} \text{ if } -i_s < i < +i_s \quad (7)$$

Figure 5:
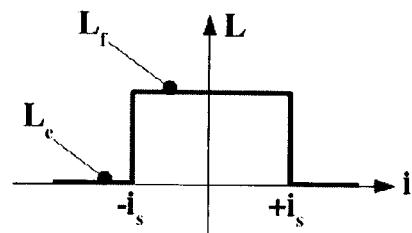

FIG. 5 illustrates an idealized inductance value as a function of the excitation current. When the magnetic material is not saturated, this value can be obtained from $$L_f = \frac{\mu_0 \cdot \mu_r \cdot S_f \cdot N^2}{l_f} \quad (8)$$

Once saturation is reached, the inductance value is described by:

$$L_e = \frac{\mu_0 \cdot S_f \cdot N^2}{l_f} \quad (9)$$

The inductance value $L_f$ is $\mu_r$ times higher than $L_e$. For example, in the case of a test prototype, $L_f = 22$ H while $L_e = 2$ mH. In the following, we will make the hypothesis that the saturated value of the inductance $L_e$ is zero. Taking the current flow directions shown in FIG. 2, the characteristic L(i) shifts to the left by applying a positive current to the primary and in case of negative primary current, the characteristic shifts to the right. This shifting is correlated to the primary current, and theoretically proportional to the primary current as demonstrated below.

Shifting of the Inductance Characteristic:

Let us consider $H_P$, the magnetic field strength created by the primary current. We can write:

$$B(H) = \mu_0 \cdot \mu_r \cdot (H - H_P) \quad (10)$$

By replacing (2) into (10) we obtain:

$$B = \mu_0 \cdot \mu_r \cdot \left( \frac{N}{l_f} i - \frac{1}{l_f} \cdot I_P \right) \quad (11)$$

And replacing (11) into (3) we obtain:

$$\Psi = \mu_0 \cdot \mu_r \cdot \left( \frac{N}{l_f} i - \frac{1}{l_f} \cdot I_P \right) \cdot S_f \cdot N \quad (12)$$

$$\boxed{\Psi(i) = \frac{\mu_0 \cdot \mu_r \cdot S_f \cdot N^2}{l_f} \cdot \left( i - \frac{I_P}{N} \right)} \quad (13)$$

From (13) it can be seen that the amount of shifting of the flux characteristics is $I_P/N$.

Figure 6:
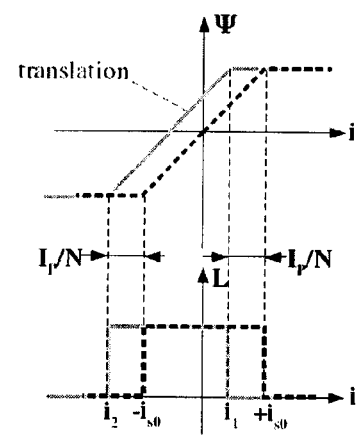
FIG. 6 is a graphical illustration of a shifting of the inductance value for a primary current (current to be measured) greater than zero ($I_P>0$)

FIG. 6 illustrates a shifting of the inductance value for a positive primary current ($I_P > 0$). The current $i_{s0}$ is the value of the saturation excitation current for $I_P = 0$. In this case the characteristic L(i) is symmetrical and $+i_{s0} = -i_{s0}$. For a non-zero primary current $I_P$ the positive saturation current is $i_1$, while the negative saturation current is $i_2$. In this case the characteristic L(i) is not symmetrical any more. With a positive primary current: $i_1 < |i_2|$, the characteristic's parameters can be calculated as:

$$i_{s0} = \frac{\Psi_s}{L_f} = \frac{B_s \cdot S_f \cdot N \cdot l_f}{\mu_0 \cdot \mu_r \cdot S_f \cdot N^2} = \frac{B_s \cdot l_f}{\mu_0 \cdot \mu_r \cdot N} \quad (14)$$

$$|i_1| = i_{s0} - \frac{I_P}{N}; \quad (15)$$

$$|i_2| = i_{s0} + \frac{I_P}{N} \quad (16)$$

As an example, in a prototype tested with $+i_{s0} = 7$ mA and N=1000, a primary current of 1 A caused a positive saturation limit of $i_1 = (0.007 - 1/1000)$ A = 6 mA.

Measuring Circuit

FIG. 7 illustrates a measuring circuit layout of an embodiment of a sensor according to this invention. The current to be measured is the primary current of a current transformer built with a suitable toroidal core. The secondary (measuring) circuit is made of a DC voltage source $V_C = 12$ V, supplying an H-bridge circuit design made of MOSFETs. The H-bridge excites the secondary coil alternatively with a positive and a negative voltage. The coil resistance is $R_s$. The excitation current is measured with the resistance $R_m$. A measurement cycle may comprise four steps. At the beginning of the measuring sequence, the inductance is "unloaded", i.e. the current in the winding is zero, and all switches are open.

Step 1) The MOSFETs "P" are switched on. The inductor 4 which represents an inductance L is charged with a positive current +i, according to the directions shown in FIG. 7. Once saturation is reached, the transistors are switched off.

Step 2) The inductance discharges itself through the freewheeling diodes of the "N" switches. Before passing to next step, the inductance is preferably completely discharged.

Step 3) The MOSFETs "N" are switched on. This time a negative current in the inductance builds up. When saturation is reached, the switches are turned off.

Step 4) The inductance discharge itself through the freewheeling diodes of the "P" switches. Again the discharge of the inductance is preferably completed before the beginning of next sequence.

The measured values of the times $t_1$, $t_2$ to reach saturation and of the average excitation current $i_{average}$ during phases P resp. N are used to calculate the primary current. These operations may be performed by a microcontroller (not shown) to which the measuring circuit is connected, during the two charging periods, for example making use of an ADC unit and a timer of the microcontroller. When saturation is reached, the rapid increase of the excitation current i through the measuring resistance $R_m$, may be detected through a comparator. The saturation time $t_1$, $t_2$ is calculated between the closing of the switches and the detection of saturation. The average value of the excitation current $i_{average}$ can then be calculated. For a zero primary current, a measuring sequence requires for example about 180 ms.

Measuring Method for Low Primary Currents

By applying a positive primary current, taking the current flow directions shown in FIG. 2, the inductance characteristic L=L(i) shifts toward the left. It can be demonstrated that this shift is proportional to the primary current $I_P$. If the primary current ($I_P/N$) is negative, the inductance characteristic shifts toward the right. In FIG. 8, $t_1$ is the saturation time for a positive current, $t_2$ is the saturation time for a negative current, i, is the positive saturation current and $i_2$ is the negative saturation current. This shift has a consequence on the time to saturation of the inductor (FIG. 8).

In order to calculate the time domain behavior of this circuit, the resistive part of the circuit (R=$R_s$+$R_m$) can be neglected. Indeed the saturation times are small (typically 20 ms) in comparison with the time constant ($L_f$=22 H and R=5Ω).

Then, after applying the voltage step we obtain the linear relationship:

$$i(t) = \frac{V_C}{L_f} \cdot t \quad (17)$$

The excitation current is linearly and directly related to the primary current. Once saturation is reached, the current increases instantaneously ($L_e$=0) up to its steady-state value:

$$i(t) = \frac{V_C}{R} \quad (18)$$

The primary current is a function of the times to saturation. In FIG. 8 the behaviour for a positive primary current is shown. FIG. 8 illustrates saturation times $t_1$ and $t_2$ for a positive primary current $$\frac{|i_1|}{t_1} = \frac{|i_2|}{t_2} \quad (19)$$

By replacing (15) and (16) into (19) we obtain $$\frac{i_{s0} - \frac{I_P}{N}}{t_1} = \frac{i_{s0} + \frac{I_P}{N}}{t_2} \quad (20)$$

and by replacing (14) into (20) we obtain $$I_P = \frac{B_s \cdot I_f}{\mu_0 \cdot \mu_r} \cdot \left(1 - 2 \cdot \frac{t_1}{t_1 + t_2}\right) \quad (21)$$

The H-bridge supply voltage $V_C$ doesn't appear explicitly in this equation, so a precise stabilization of this voltage is not required. Once saturation is reached, the excitation current attains the steady-state value of $V_C/R$. As an example, in a test prototype, this value was $V_C/R$=2.4 A, however, the MOSFETs were switched off at about 1.25 A ($i_{threshold}$) because the application didn't require a higher current value.

The above measuring method for small primary currents can be used for primary currents respecting the following condition:

$$\left|\frac{I_P}{N}\right| < i_{s0} \quad (22)$$

As an example, in a test prototype this condition means a measuring range (primary current) of ±7 A. For higher primary current values, a different measuring method is used.

Measuring Method for High Primary Currents

If $|I_P/N|>i_{s0}$, the characteristics L(i) translate far to the left. This means that the inductance is already saturated without any excitation current flowing. With a large negative primary current, the phenomenon is the same but reversed (shift to the right). FIG. 9 illustrates relationships between $I_P$ and $i_{average}$. The relationships established for the measurement of small primary currents discussed above can no longer be used. In this case, the measurement is made by evaluating the average value of the excitation current during the phases "P" or "N". The average value $i_{average}$ of the characteristics illustrated in FIG. 9, which corresponds to the inductor current when the magnetic core 10 is not saturated, represents $I_P/N$. In order to obtain the primary current, we can calculate the average value of the excitation current (value between $i_n$ and $i_n'$) and multiply it by the number of turns.

$$|I_P|=i_{average} \cdot N \quad (23)$$

EXAMPLE

An exemplary embodiment has the following characteristics

Measuring range: 0 . . . ±1000 A DC
Error @Ta=25° C.: ±10 mA for $I_P$=0 to ±1 A: ±1% for $I_P$=1±1000 A
Supply voltage: 12 V
Supply current: 250 mA (average)
Settling time: ≤1 s
Output type: digital
Measuring Signals The FIG. 11 shows the times to saturation for zero primary current. The P (respectively N) signal imposes the beginning of the positive (respectively negative) charging phase. The $U_m$ signal is the voltage on the measuring resistance $R_m$.

From (17) in our case we can find:
for $I_P=0$:

$$t_1 = t_2 = \frac{i_{s0}}{\frac{V_C}{L_f}} = \frac{7 \cdot 10^{-3}}{\frac{12}{20}} = 12.8 \text{ ms}$$

After this time, due to the saturation of the inductor, the voltage $U_m$ reaches the opening voltage of the switches $$U_m = i \cdot R_m \tag{24}$$

$$U_{m\,off} = i_{off} \cdot R_m = 1.25 \cdot 2 = 2.5V$$

After that, the diodes' free-wheeling current imposes a negative voltage $U_m$.

FIG. 11 illustrates saturation times for $I_P=0$.

FIG. 12 shows the measuring voltage with a primary current of +1000 A and illustrates Voltage $U_m$ at $I_P=+1000$ A. For the positive excitation current, the threshold is reached immediately, and this allows to determine the flow direction of the primary current. For a negative excitation current, relation (23) allows the calculation of its average value:

$$i_{average} = \frac{|I_P|}{N} = \frac{1000}{1000} = 1A$$

According to (24), the voltage $U_m$ is $$U_m = 1 \cdot 2 = 2V$$

Tests Results

Each measuring cycle, the transducer's digital output transmits the value of the primary current. FIGS. 13, 14 and 15 represent the error of the transducer current as a function of the primary current ($T_a=25°$ C.) for the tested prototype discussed above. FIG. 13 illustrates a transducer current error (mA) for $$-1 A \leq I_P \leq 1 A;$$

FIG. 13 illustrates a transducer current error (%) for $$-15 A \leq I_P \leq 15 A; \text{ and}$$

FIG. 15 illustrates a transducer current error (%) for $$-1000 A \leq I_P \leq 1000 A.$$

References

[1] W. Teppan, "Transfer Functions of Current Sensors", 5th Int. IMEKO, TC-4 Symposium on Electrical Measuring Instruments for Low and Medium Frequencies, Vienna, Austria, 8-10 Apr. 1992

Waltari, T. Suntio: "Survey and evaluation of battery monitoring methods and results from user's viewpoint", 21st International Telecommunications Energy Conference, 1999. INTELEC '99, 6-9 Jun. 1999 Page(s):7 pp.

The invention claimed is:

1. Electrical current sensor comprising a measuring circuit and an inductor for measuring a primary current $I_p$ flowing in a primary conductor over a current range from a minimum specified current amplitude to a maximum specified current amplitude, the inductor comprising a saturable magnetic core made of a highly permeable magnetic material and a secondary coil for carrying an alternating excitation i configured to alternatingly saturate the magnetic core, said secondary coil being connected to the measuring circuit, wherein the measuring circuit is configured to supply a positive or negative voltage to the inductor, to switch off said positive or negative voltage when a condition signalling saturation is reached, to measure a time to saturation $t_1$ in one direction and a time to saturation $t_2$ in another direction of the magnetic core and determine therefrom a value of the primary current for primary currents having an amplitude in a first portion of the current range from the minimum specified current to a transition amplitude, the measuring circuit being further configured for evaluating an average value of said alternating excitation current i during phases when a voltage is supplied to the inductor and before the saturation condition is reached, and determining therefrom a value of the primary current for primary currents having an amplitude in a second portion of the current range from the transition amplitude to the maximum specified current amplitude.

2. Electrical current sensor according to claim 1 wherein the measuring circuit includes a DC voltage source $V_c$, and an H-bridge circuit supplied by the DC voltage source configured to excite the secondary coil alternatively with a positive and a negative voltage.

3. Electrical current sensor according to claim 2 wherein switches of the H-Bridge comprise MOSFETs.

4. Electrical current sensor according to claim 1, wherein the measuring circuit comprises a resistance $R_m$ to measure the excitation current.

5. Electrical current sensor according to claim 1 wherein the saturable magnetic core is annular and closed.

6. Electrical current sensor according to claim 1 further including a microcontroller to which the measuring circuit is connected, the microcontroller comprising a timer for measuring the saturation times $t_1$, $t_2$.

7. A method of measuring an electrical current flowing in a primary conductor over a current range from a minimum specified current amplitude to a maximum specified current amplitude comprising:
  providing a current sensor including a measuring circuit and an inductor, the inductor comprising a secondary coil wound around a saturable magnetic core,
  applying an excitation voltage to the secondary coil to alternatingly saturate the magnetic core,
  evaluating an average value of an alternating excitation current during phases when the excitation voltage is applied for measurement of large primary currents, and
  measuring times to saturation $t_1$, $t_2$ of the magnetic core of a negative, respectively positive signal of the alternating excitation current and for small currents determining a primary current based on the relationship of alternating saturation times $t_1$, $t_2$,
  where small primary currents have amplitudes in a first portion of the current range from the minimum specified current $I_{min}$ to a transition or intermediate amplitude, and large primary currents have an amplitude in a second portion of the current range from the transition amplitude to the maximum specified current amplitude $I_{max}$.

8. Method according to claim 7, wherein for primary currents $I_p$ that are small, the primary current is based on a value of the saturation time in one direction divided by a sum of the saturation times in both directions.

9. Measuring method according to claim 7, wherein a measuring method for small currents is employed for primary currents respecting the following condition:

$$\left|\frac{I_P}{N}\right| < i_{s0} \tag{22}$$

where $I_p$ is primary current, N the number of turns of the secondary coil, and $i_{s0}$ a value of the saturation excitation current for a primary current that is 0.

10. Method according to claim 7, wherein for large primary currents the measurement of the primary current is based on an evaluation of the average value of the excitation current during the phases when an excitation voltage is supplied.

11. Method according to claim 7, wherein the measuring circuit includes a DC voltage source $V_c$, and an H-bridge circuit with transistor switches supplied by the DC voltage source configured to excite the secondary coil alternatively with a positive (P) and a negative (N) voltage, comprising the steps of:

switching on the transistors configured to supply a positive voltage to the excitation coil thus charging the inductor (4) with a positive current +i until saturation of the magnetic core is reached, switching off the transistors;

measuring the time $t_1$ to reach saturation;

discharging the inductance;

switching on the transistors configured to supply a negative voltage to an excitation coil thus charging the inductor (4) with a negative current −i, and once saturation of the magnetic core is reached, switching off the transistors;

measuring the time $t_2$ to reach saturation;

discharging the said inductor.

12. Method according to claim 11 wherein saturation of the magnetic core is detected through a comparator by determining reaching a certain threshold of the excitation current i through a measuring resistance $R_m$.

13. Method according to claim 12 wherein the saturation times $t_1$, $t_2$ are determined between a closing of the switches and a detection of saturation.

14. Method according to claim 13 wherein a value of the saturation times are calculated by a microcontroller to which the measuring circuit is connected, making use of a timer unit of a microcontroller.

\* \* \* \* \*